(12) United States Patent
Swaminathan

(10) Patent No.: US 9,863,063 B2
(45) Date of Patent: Jan. 9, 2018

(54) WEIR FOR INHIBITING MELT FLOW IN A CRUCIBLE

(71) Applicant: SunEdison, Inc., St. Peters, MO (US)

(72) Inventor: Tirumani N. Swaminathan, Creve Couer, MO (US)

(73) Assignee: Corner Star Limited, Kowloon (HK)

(*) Notice: Subject to any disclaimer, the term of this patent is extended or adjusted under 35 U.S.C. 154(b) by 470 days.

(21) Appl. No.: 14/107,743

(22) Filed: Dec. 16, 2013

(65) Prior Publication Data

US 2014/0174337 A1  Jun. 26, 2014

Related U.S. Application Data

(60) Provisional application No. 61/738,718, filed on Dec. 18, 2012.

(51) Int. Cl.
*C30B 15/12* (2006.01)
*C30B 15/00* (2006.01)
*C30B 11/00* (2006.01)

(52) U.S. Cl.
CPC ............ *C30B 15/12* (2013.01); *C30B 15/002* (2013.01); *C30B 11/002* (2013.01); *Y10T 117/1052* (2015.01)

(58) Field of Classification Search
CPC ....... C30B 15/00; C30B 15/002; C30B 15/02; C30B 15/10; C30B 15/12; C30B 15/20; C30B 35/00; C30B 35/002; Y10T 117/00; Y10T 117/10; Y10T 117/1004; Y10T 117/1008; Y10T 117/1024; Y10T 117/1032; Y10T 117/1052; Y10T 117/1056

USPC .... 117/11, 13–15, 30–31, 33, 200–202, 206, 117/208, 213–214, 912, 928, 931–932
See application file for complete search history.

(56) References Cited

U.S. PATENT DOCUMENTS

| | | | |
|---|---|---|---|
| 4,944,834 A * | 7/1990 | Tada | C30B 15/14 117/213 |
| 5,034,200 A | 7/1991 | Yamashita et al. | |
| 5,284,631 A | 2/1994 | Kaneto et al. | |
| 5,871,581 A * | 2/1999 | Atami | C30B 15/02 117/200 |
| 2008/0134958 A1* | 6/2008 | Bender | C30B 15/02 117/15 |

FOREIGN PATENT DOCUMENTS

| | | |
|---|---|---|
| CN | 1160779 A | 10/1997 |
| DE | 3840445 A1 | 6/1989 |
| DE | 19700516 A1 | 7/1997 |
| JP | H05310495 | 11/1993 |

OTHER PUBLICATIONS

International Search Report and Written Opinion of the International Searching Authority regarding PCT/US2013/075580 dated Feb. 17, 2014, pp. 14.

* cited by examiner

*Primary Examiner* — Kenneth A Bratland, Jr.
(74) *Attorney, Agent, or Firm* — Armstrong Teasdale LLP

(57) ABSTRACT

A system for growing a crystal ingot includes a crucible and a weir. The crucible has a base and a sidewall for the containment of a silicon melt therein. The weir is located along the base of the crucible inward from the sidewall of the crucible. The weir has a body connected with at least a pair of legs disposed to inhibit movement of the silicon melt therebetween.

16 Claims, 7 Drawing Sheets

WEIR FOR INHIBITING MELT FLOW IN A CRUCIBLE

CROSS REFERENCE

This application claims priority to U.S. Provisional Application No. 61/738,718 filed Dec. 18, 2012, the disclosure of which is hereby incorporated by reference in its entirety.

FIELD

This disclosure generally relates to systems and methods for the production of ingots of semiconductor or solar material and more particularly to systems and methods for reducing dislocations in the ingot by limiting or inhibiting movement within a silicon melt.

BACKGROUND

In the production of single silicon crystals grown by the Czochralski (CZ) method, polycrystalline silicon is first melted within a crucible, such as a quartz crucible, of a crystal pulling device to form a silicon melt. The puller then lowers a seed crystal into the melt and slowly raises the seed crystal out of the melt. To produce a single high quality crystal using this method, the temperature and the stability of the surface of the melt immediately adjacent to the ingot must be maintained substantially constant. Prior systems for accomplishing this goal have not been completely satisfactory. Thus, there exists a need for a more efficient and effective system and method to limit temperature fluctuation and surface disruptions in the melt immediately adjacent to the ingot.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

A first aspect is a system for growing a crystal ingot from a silicon melt. The system includes a crucible and a weir. The crucible has a base and a sidewall for containing the silicon melt therein. The weir is located along the base of the crucible at a location inward from the sidewall. The weir has a body and at least a pair of legs for inhibiting movement of the silicon melt therebetween. In some embodiments, the body is formed as a single unit with at least one of the legs.

Another aspect is a method for growing a crystal ingot. The method includes providing a crucible with a weir that has an inner leg and an outer leg forming a space therebetween, placing a feedstock material into the crucible at a location that is outward of the weir; melting the feedstock material to form a melt that is able to flow to a location that is inward of the weir; and causing the melt to cool to form a crystal ingot.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Figure 1:
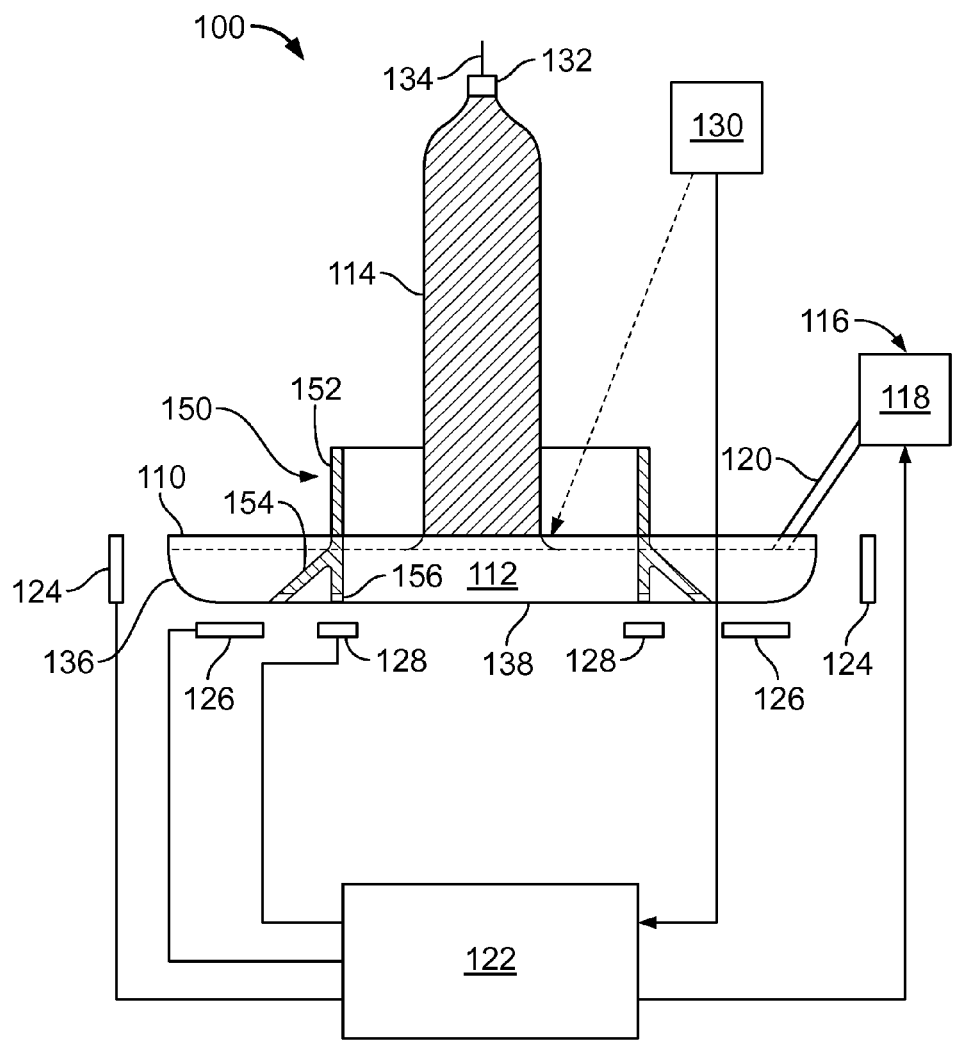
FIG. 1 is a side cross sectional view of a crystal growing system in accordance with one embodiment.

Referring to FIG. 1, a crystal growing system is shown schematically and is indicated generally at 100. The crystal growing system 100 is used to produce a large crystal or ingot by the Czochralski method. The crystal growing system 100 includes a crucible 110 that contains a silicon melt 112 from which an ingot 114 is being pulled from the melt by a puller 134.

During the crystal pulling process, a seed crystal 132 is lowered by a puller or puller system 134 into a melt 112 and then slowly raised from the silicon melt. As seed crystal 132 is slowly raised from melt 112, silicon atoms from the melt align themselves with and attach to the seed crystal to form an ingot 114.

The crucible 110 has a sidewall 136 and a base 138. The sidewall 136 extends around the circumference of base 138 to form a cavity. Solid feedstock material 116 may be placed into the cavity of crucible 110 from feeder 118 through feed tube 120.

The feedstock material 116 is at a much lower temperature than the surrounding melt 112 and absorbs heat from the melt as the feedstock material's temperature rises, and as the feedstock material itself melts. As feedstock material 116 (sometimes referred to as "cold feedstock") absorbs energy from melt 112 the temperature of the surrounding melt falls proportionately.

As discussed herein, the system is described in relation to the Czochralski method of producing single crystal ingots.

However, the system disclosed herein may also be used to produce multi-crystalline ingots, such as by a directional solidification process.

The amount of feedstock material 116 added is controlled by feeder 118, which is responsive to activation signals from a controller 122. The amount of cooling of the melt 112 is precisely determined and controlled by controller 122. Controller 122 either adds or does not add feedstock material 116 to adjust the temperature and the mass of the melt 112. The addition of feedstock material 116 may be based on the mass of the silicon in the crucible, e.g., by measuring the weight or measuring liquid height of the melt. As feedstock material 116 is added to melt 112, the surface of the melt may be disturbed. This disturbance also affects the ability of silicon atoms of the melt 112 to properly align with the silicon atoms of the seed crystal 132.

Heat is provided to crucible 110 by heaters 124, 126, and 128 located at suitable positions about the crucible. Heat from heaters 124, 126, and 128 initially melt the solid feedstock material 116 and then maintains melt 112 in a liquefied state. Heater 124 is generally cylindrical in shape and provides heat to the sides of the crucible 110, and heaters 126 and 128 provide heat to the bottom of the crucible. In some embodiments, heaters 126 and 128 are generally annular in shape.

Heaters 124, 126, and 128 are resistive heaters coupled to controller 122, which controllably applies electric current to the heaters to alter their temperature. A sensor 130, such as a pyrometer or like temperature sensor, provides a continuous measurement of the temperature of melt 112 at the crystal/melt interface of the growing single crystal ingot 114. Sensor 130 also may be directed to measure the temperature of the growing ingot. Sensor 130 is communicatively coupled with controller 122. Additional temperature sensors may be used to measure and provide temperature feedback to the controller with respect to points that are critical to the growing ingot. While a single communication lead is shown for clarity, one or more temperature sensor(s) may be linked to the controller by multiple leads or a wireless connection, such as by an infra-red data link or another suitable means.

The amount of current supplied to each of the heaters 124, 126, and 128 by controller 122 may be separately and independently chosen to optimize the thermal characteristics of melt 112. In some embodiments, one or more heaters may be disposed around the crucible to provide heat.

As discussed above, seed crystal 132 is attached to a portion of puller 134 located over melt 112. The puller 134 provides movement of seed crystal 132 in a direction perpendicular to the surface of melt 112 allowing the seed crystal to be lowered down toward or into the melt, and raised up or out of the melt. To produce a high quality ingot 114, the melt 112 in an area adjacent to seed crystal 132/ingot 114 must be maintained at a substantially constant temperature and surface disruptions must be minimized.

To limit the surface disturbances and temperature fluctuations in the area immediately adjacent to seed crystal 132/ingot 114, a baffle or weir 150 is placed in the cavity of the crucible 110 to separate the melt 112 into an inner melt portion and an outer melt portion.

Figure 2:
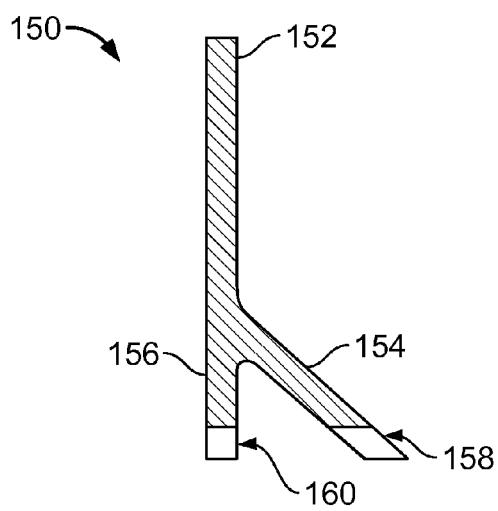
FIG. 2 is a partial cross sectional view of a weir used in the crystal growing system of FIG. 1.
Figure 3:
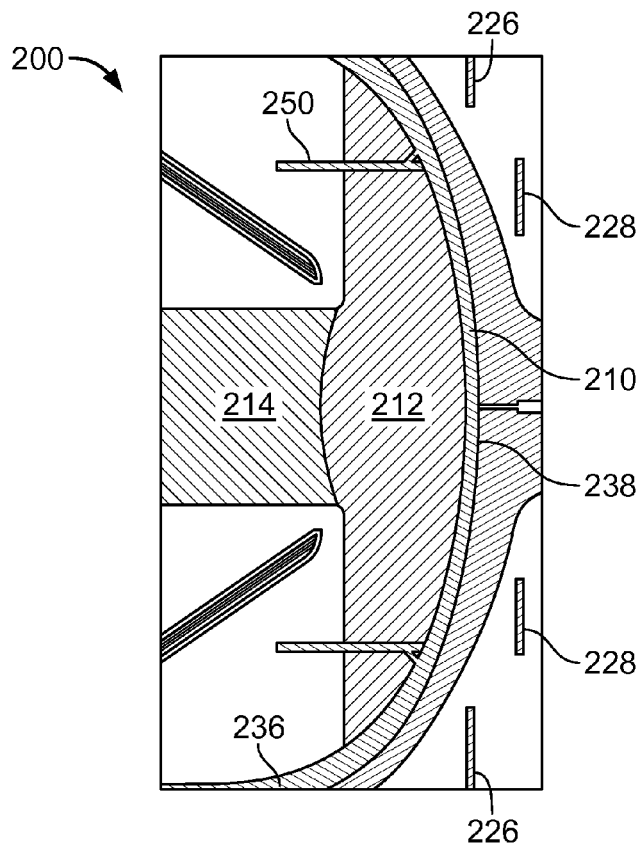
FIG. 3 is a partial cross sectional view of a crystal growing system in accordance with another embodiment.
Figure 4:
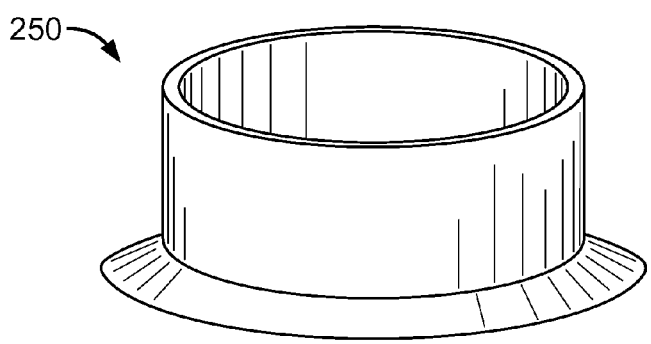
FIG. 4 is a top perspective view of a weir used in the crystal growing system of FIG. 3.
Figure 5:
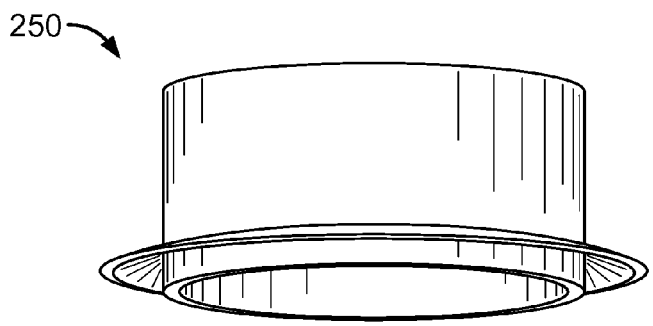
FIG. 5 is a bottom perspective view of the weir of FIG. 4.
Figure 6:
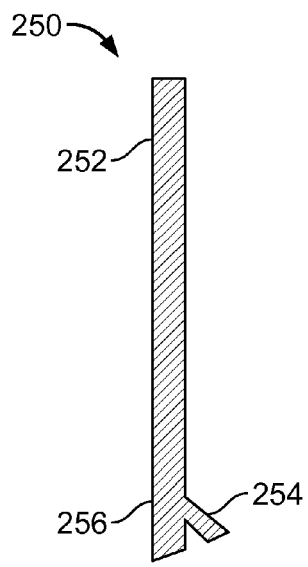
FIG. 6 is a partial cross sectional view of the weir of FIGS. 4-5.
Figure 7:
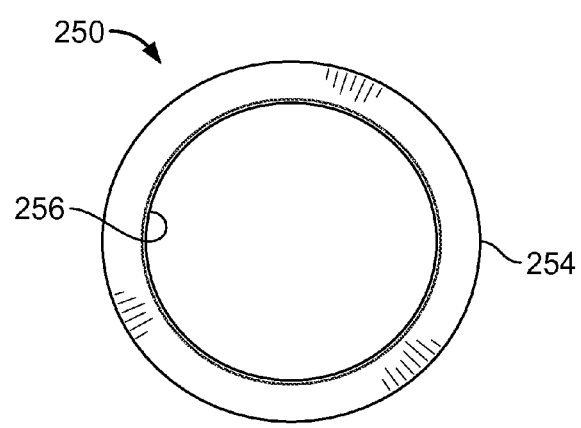
FIG. 7 is a top elevation of FIG. 4-6.

With additional reference to FIG. 2, the weir 150 has a body 152, an outer leg 154, and an inner leg 156. Both outer leg 154 and inner leg 156 extends downward from the upwardly extending body 152 and rest against a top surface of base 138 of crucible 110. The outer leg 154 and inner leg 156 are separated by a space that forms intermediate melt portion. The outer melt portion is between sidewall 136 of crucible 110 and weir 150. The intermediate portion is between the outer leg 154 and the inner leg 156 of weir 150. The inner melt portion is inward from weir 150 and is adjacent to the seed crystal 132/ingot 114.

The outer leg 154 and inner leg 156 limit movement of melt 112 between the melt portions. Movement of melt 112 between the melt portions may be permitted through passages 158, 160 in a lower section of each the outer leg 154 and inner leg 156, respectively.

The movement of the melt 112 is substantially limited to the location of the passages 158, 160. Placing the passages 158, 160 along a lower section of outer leg 154 and inner leg 156, confines the movement of melt 112 to along the base 138 of the crucible 110. Any movement of melt 112 into the inner melt portion is at a direct opposite location from the top of the melt, where ingot 114 is being pulled. This confinement of the melt movement limits surface disruptions and temperature fluctuations along the top of the inner melt portion of the melt 112.

The passages 158, 160 permit controlled movement of melt 112 between the outer melt portion and the intermediate melt portion and the inner melt portion. Inhibiting or limiting the melt movement between the melt portions allows silicon material in the outer melt portion to heat to a temperature that is approximately equivalent to the temperature of the inner melt portion as the silicon material passes into and through the intermediate melt portion.

The passages may be aligned to allow controlled flow of the melt from the outer melt portion, through the intermediate melt portion, and into the inner melt portion. In some embodiments, the passages through the outer leg may be unaligned with the passages of the inner leg for further restricting the flow from the outer melt portion, through the intermediate portion, and into the inner melt portion.

Referring to FIGS. 3-8, a crystal growing system 200 in accordance with another embodiment is shown. The crucible 210 has a sidewall 236 extending around the circumference of a concave base 238 to form a cavity.

Heat is provided to crucible 210 from heaters 226 and 228 to initially melt material within the crucible 210 and then to maintain melt 212 in a liquefied state. Heaters 226 and 228 are generally annular in shape and arranged about the base 238 of the crucible 210. Heaters 226 and 228 may be resistive heaters.

As discussed above, a seed crystal is lowered into the melt 212, and then slowly raised out of the melt. To limit the surface disturbances and temperature fluctuations in the area immediately adjacent to ingot 214, a weir 250 is placed within the crucible 210 to separate the melt 212 into an inner melt portion and an outer melt portion.

The weir 250 has a body 252, an outer leg 254, and an inner leg 256. Both outer leg 254 and inner leg 256 extend downward from the upwardly extending body 252 and rest against an inner surface of crucible 210. The outer leg 254 and inner leg 256 are separated by a space that forms an intermediate melt portion between the outer leg 254 and the inner leg 256 of weir 250. The inner melt portion is inward from weir 250, adjacent to the ingot 214.

Movement of melt 212 between the various melt portions is limited by outer leg 254 and inner leg 256 to the bottom of the melt, along the base 238 of the crucible 210, directly opposite from ingot 214. This confinement of the melt movement limits surface disruptions and temperature fluctuations along the top of the inner melt portion of the melt 212, which is adjacent to the pulled ingot 214. Inhibiting the melt movement to along base 238, adjacent heaters 226 and 228, allows silicon material from the outer melt portion to heat to a temperature that is approximately equivalent to the temperature of the inner melt portion as the silicon material passes through the intermediate melt portion.

Figure 8:
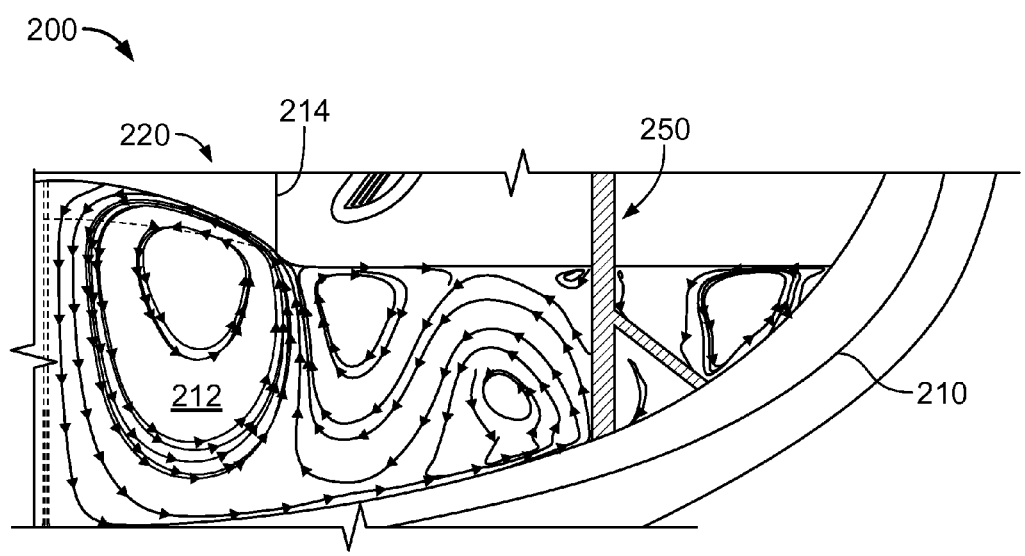
FIG. 8 is a partial cross sectional view of the crystal growing system of FIG. 3 illustrating the temperature field and streamlines of the melt.
Figure 9:
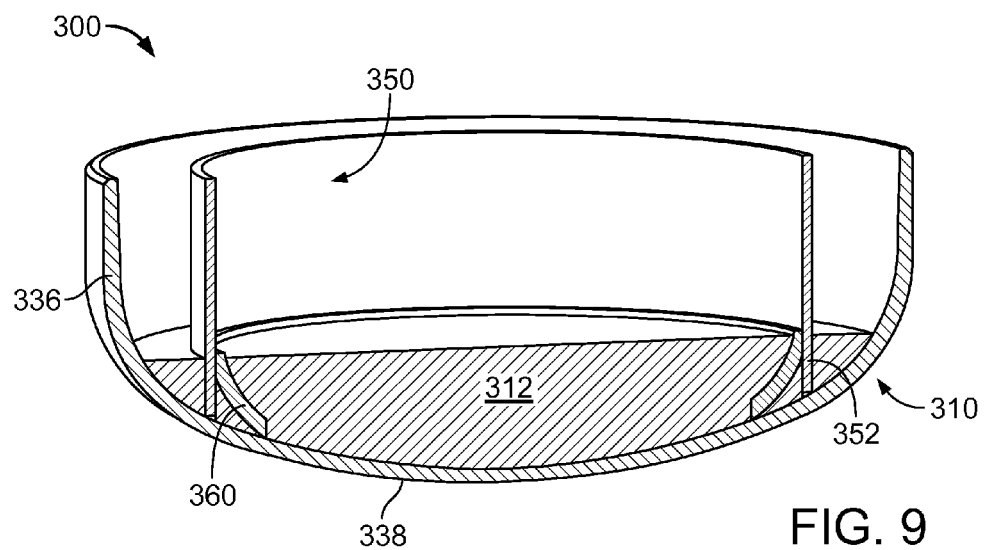
FIG. 9 is a partial cross sectional view of a crystal growing system in accordance with another embodiment.
Figure 10:
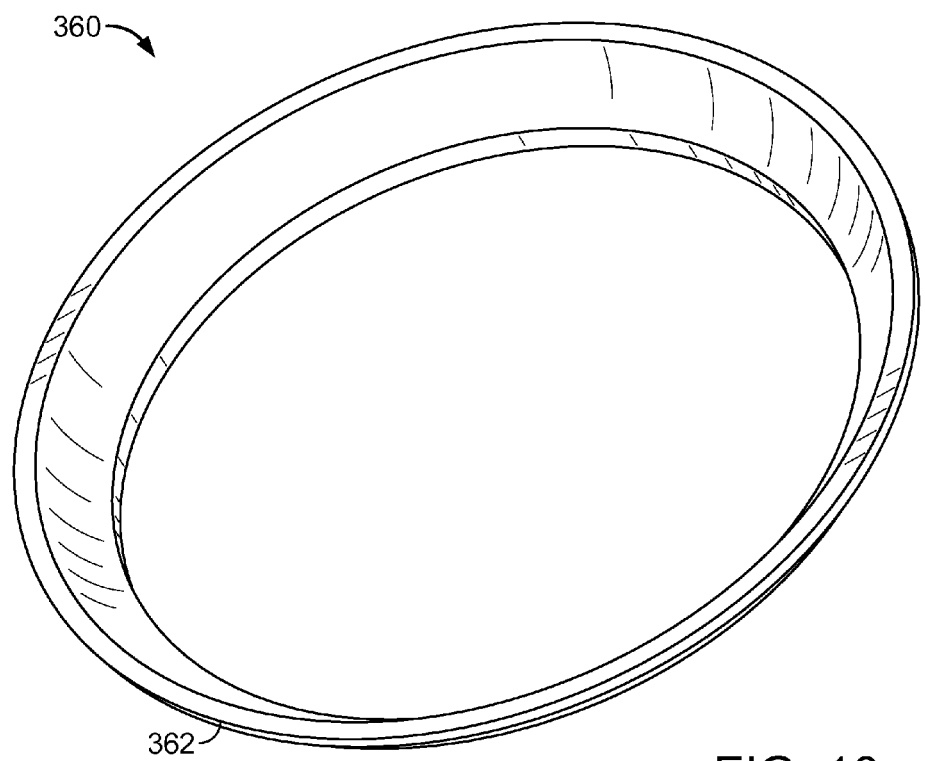
FIG. 10 is a top perspective view of a weir used in the crystal growing system of FIG. 9.
Figure 11:
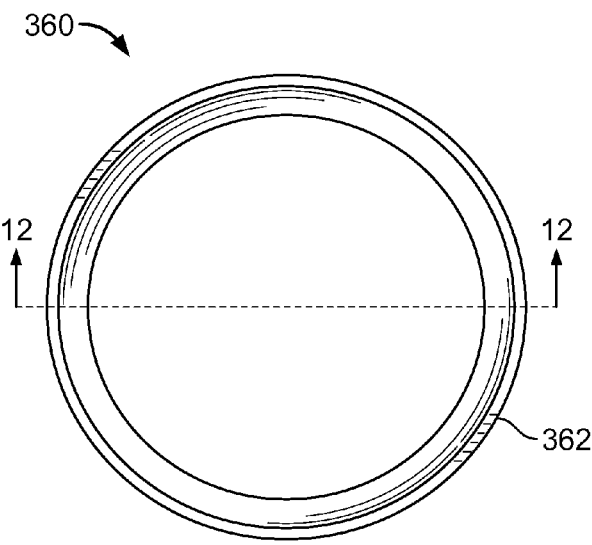
FIG. 11 is a top elevation of the weir of FIG. 10.
Figure 12:
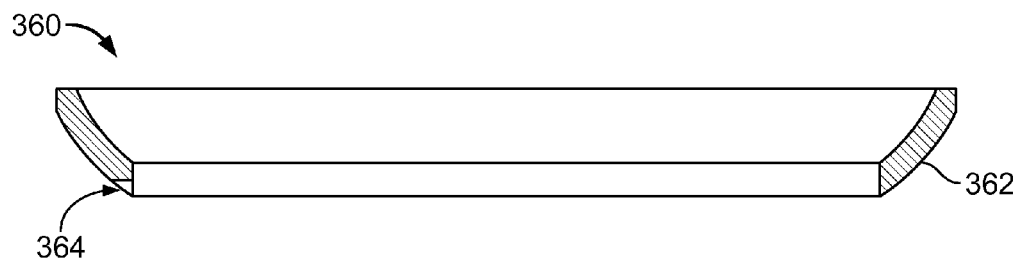
FIG. 12 is cross sectional view of the weir of FIGS. 10-11.
Figure 13:
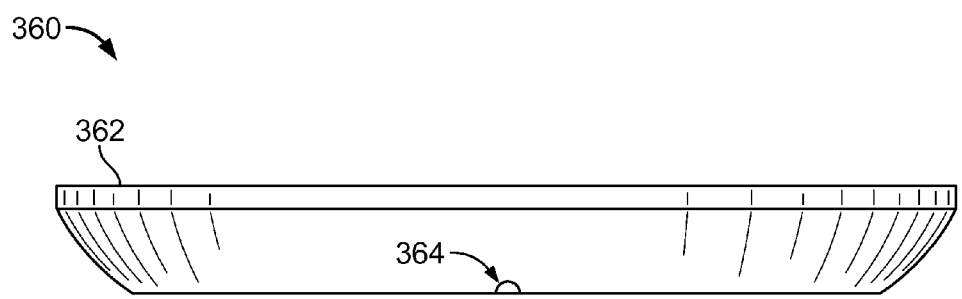
FIG. 13 is a side elevation of the weir of FIGS. 10-12.

With specific reference to FIG. 8, streamlines and temperature fields during operation are shown for crystal growing system 200. The outer melt portion is cooler than either the intermediate or inner melt portion. Additional material is added to the outer melt portion during operation of the crystal growing system lowering the temperature of the outer melt portion. As discussed above, the additional material is cooler than the melt and therefore absorbs heat from the surrounding melt when added to the melt. Forcing the cooler melt material to move along the surface of the crucible adjacent to the heaters allow heat to be transferred into the cooler material before the cooler material enters the inner melt portion.

Referring to FIGS. 9-13, a crystal growing system 300 in accordance with another embodiment is shown. A melt 312 is contained within a crucible 310 that has a sidewall 336 surrounding a concave base 338. To limit the surface disturbances and temperature fluctuations of the melt 312 in a center area of the crucible 310, a weir 350, and a separator 360 are placed within the crucible 310 to separate the melt 312 into an outer melt portion, an intermediate melt portion, and an outer melt portion. The inner melt portion forms the center area that is inward from the weir 350 and separator 360.

The weir 350 is a cylindrical body with an open top and bottom. The bottom 352 of the weir 350 is located adjacent to the inner surface of the crucible 310. The separator 360 is a circular ring 362 having a convex shape. The diameter of the outer circumference of the separator 360 is less than the diameter of the inner circumference of the weir 350. The separator 360 may have a radial passage 364 extending along a lower edge. Movement of the melt 312 is permitted through radial passage 364.

The outer melt portion is between sidewall 336 of crucible 310 and weir 350. The intermediate portion is between weir 350 and separator 360. The inner melt portion is inward from separator 360.

Movement of melt 312 between the various melt portions is limited to along the inner surface of the crucible 310. Inhibiting the melt movement between the various melt portions allows silicon material in outer melt portion to heat to a temperature that is approximately equivalent to the temperature of the inner melt portion as the silicon material passes through the intermediate melt portion.

The passage 364 in the separator 360 may be aligned with a passage in the weir 350 to allow controlled flow of the melt from the outer melt portion through the intermediate melt portion and into the inner melt portion. In some embodiments, the passage through the body may be unaligned with the passage of the separator for restricting the flow from the outer melt portion through the intermediate portion and into the inner melt portion.

In other embodiments, the separator 360 may have a height that is greater than a height of the weir 350. In still other embodiments, the separator 360 may include a top portion that extends substantially parallel to the weir 350.

Figure 14:
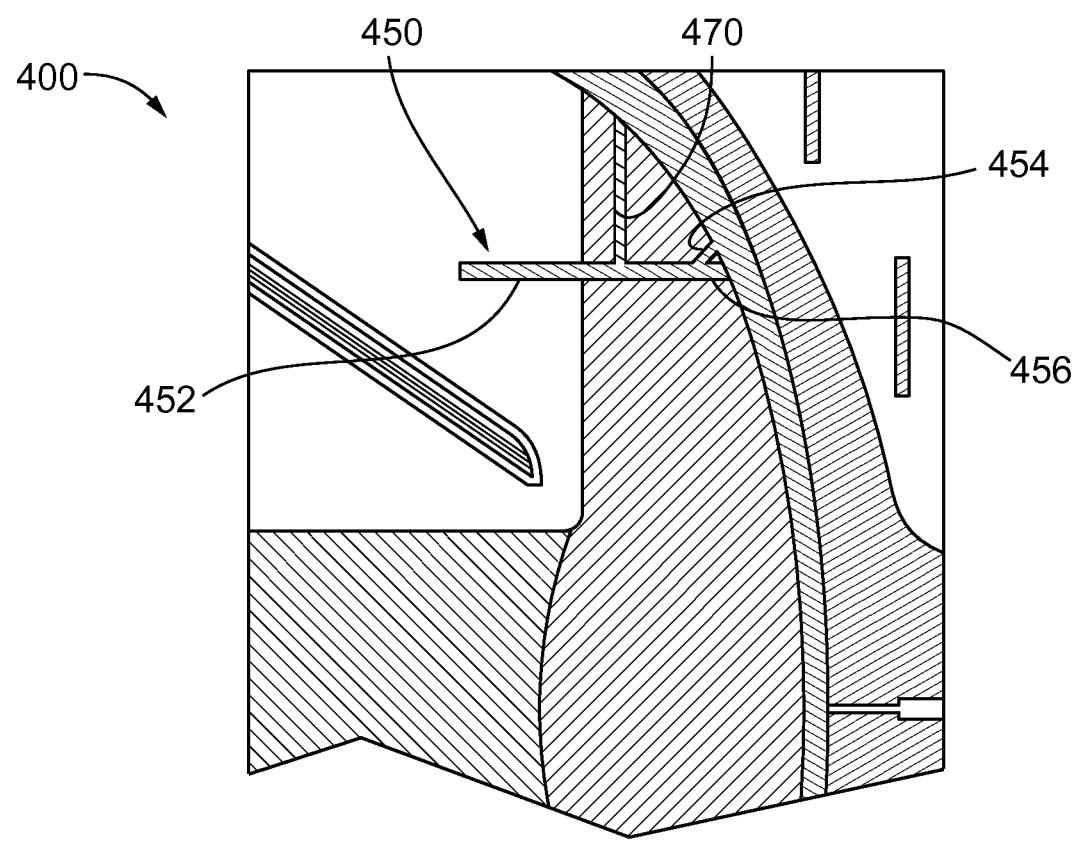
FIG. 14 is a partial cross sectional view of a crystal growing system in accordance with yet another embodiment.

Referring to FIG. 14, a crystal growing system 400 in accordance with another embodiment is shown. The crystal growing system 400 includes a weir 450. The weir 450 has a body 452, an outer leg 454, an inner leg 456, and an upper leg 470. The legs 454, 456, and 470 extend from the body 452 to rest against an inner surface of the crucible. Each of the legs 454, 456, and 470 are separated by a space that defines a melt portion. Note that other numbers of legs are contemplated within the scope of the present disclosure.

Movement of the melt between the various melt portions is limited by the legs 454, 456, and 470 to the bottom of the melt, along the base of the crucible. This confinement of the melt movement limits surface disruptions and temperature fluctuations along the top of an inner melt portion of the melt, which is adjacent to a pulled ingot. Inhibiting the melt movement to along the base, adjacent to the heaters, allows silicon material from an outer melt portion to heat to a temperature that is approximately equivalent to the temperature of the inner melt portion as the silicon material passes through the intermediate melt portions.

Figure 15:
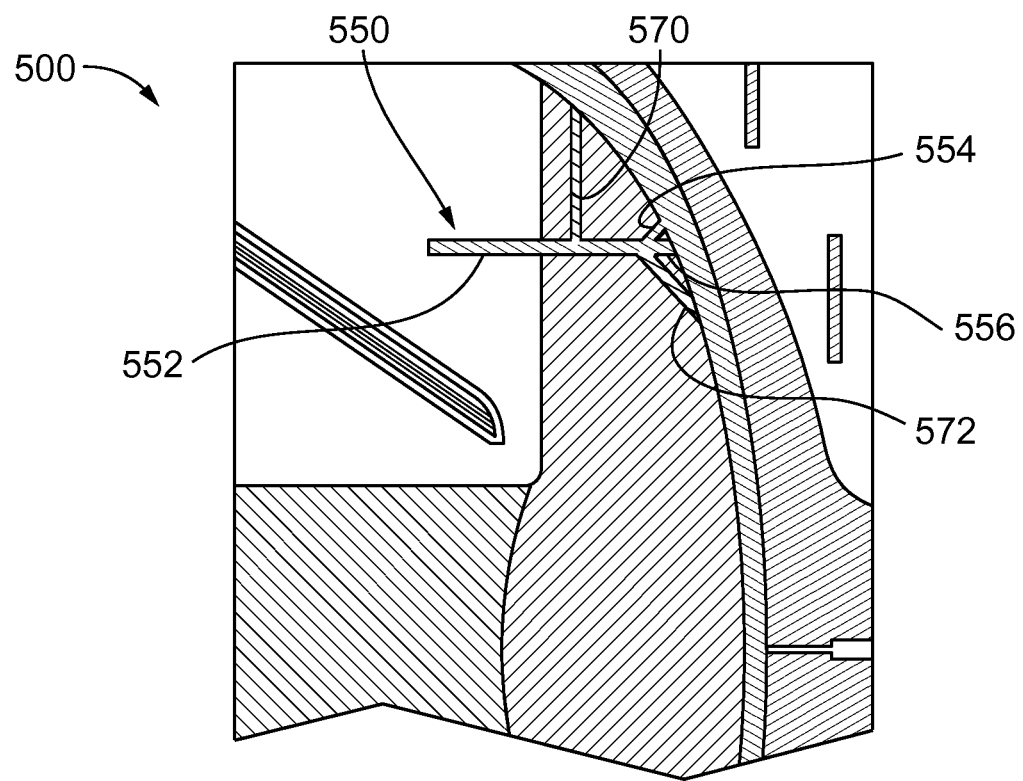
FIG. 15 is a partial cross sectional view of a crystal growing system in accordance with still another embodiment.

Referring to FIG. 15, a crystal growing system 500 in accordance with another embodiment is shown. The crystal growing system 500 includes a weir 550. The weir 550 has a body 552, an outer leg 554, an inner leg 556, an upper leg 570, and a fourth leg 572. The legs 554, 556, 570, and 572 extend from the body 552 to rest against an inner surface of crucible. Each of the legs 554, 556, 570, and 572 are separated by a space that defines a melt portion.

Movement of the melt between the various melt portions is limited by the legs 554, 556, 570, and 572 to the bottom of the melt, along the base of the crucible. This confinement of the melt movement limits surface disruptions and temperature fluctuations along the top of an inner melt portion of the melt, which is adjacent to a pulled ingot. Inhibiting the melt movement to along the base, adjacent to the heaters, allows silicon material from an outer melt portion to heat to a temperature that is approximately equivalent to the temperature of the inner melt portion as the silicon material passes through the intermediate melt portions.

In a method of one embodiment for growing a single crystal ingot, the weir and feedstock material are placed in the crucible. Heaters are placed adjacent to the crucible to provide heat for liquefying or melting the feedstock material, forming a melt. The seed crystal is lowered into and then slowly raised out of the melt to grow the ingot from the seed crystal. As the seed crystal is slowly raised, silicon atoms from the melt align with and attach to the silicon atoms of the seed crystal allowing the ingot to grow larger and larger.

The feedstock material may be placed in an area outside of the weir. As the feedstock material outside of the weir melts, the melt is allowed to move from the outer melt portion to the intermediate melt portion and then into the inner melt portion. The movement of the melt between the various melt portions is limited to passages through the outer leg and inner leg of the weir.

In other embodiments, the weir does not include passages between legs. In these embodiments movement of the melt from the outer area into the inner area is limited to movement under the weir.

Inhibiting movement of the melt between the melt portions to movement along the base allows the melt temperature to increase as the melt passes from the outer melt portion to the intermediate melt portion and then into the inner melt portion. By the time the melt reaches the inner melt portion, the melt is substantially equivalent in temperature to the melt already in the inner melt portion. Raising the temperature of the melt before reaching the inner melt portion reduces the temperature fields within the inner melt portion. The controller may act to maintain a substantially constant temperature within the inner melt portion.

Further, inhibiting movement of the melt between the melt portions to movement along the base allows the surface of the inner melt portion to remain relatively undisturbed.

The weir substantially prevents disturbances in the outer area from disrupting the surface of the inner melt portion by substantially containing the energy waves produced by the disturbances in the outer melt portion. The disturbances are also inhibited by the location of the passages. The passages are only along the bottom of each leg, which allows movement of the melt into the inner melt portion without disrupting the surface stability of the inner melt portion.

In some embodiments, the temperature of the inner melt portion may suitably be measured at a location immediately adjacent the growing ingot by a sensor. The sensor is connected with the controller. The controller adjusts the temperature of the melt by supplying more or less current to the heaters and by supplying more or less feedstock material to the melt. The controller is also capable of simultaneously supplying feedstock material while the seed crystal is raised from the melt and growing the ingot.

The presently disclosed systems provide an inner melt portion with a larger surface area than previous two weir systems that included vertically extending, tubular weirs. Thus, the presently disclosed systems provide a high melt-gas surface area near the crystal ingot while maintaining a plurality of melt zones below the surface of the melt. One advantage of the increased melt-gas surface area of the inner melt portion is that it decreases the amount of oxygen in the crystal ingot. Other advantages of the present systems include improvements in the pull rate, dam/crucible ablation rate, heater power, and power requirements.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the invention, it is intended that all matter contained in the above description and shown in the accompanying drawing[s] shall be interpreted as illustrative and not in a inhibiting sense.

What is claimed is:

1. A system for growing a crystal ingot from a silicon melt, the system comprising:
   a crucible having a base and a sidewall for containing the silicon melt therein, the base having a top surface; and
   a weir located along the base of the crucible at a location inward from the sidewall, the weir having a body connected with at least a pair of legs disposed to inhibit movement of the silicon melt therebetween, each leg having a bottom surface, wherein each leg extends downward from the body and engages the top surface of the base to prevent flow of the silicon melt between the bottom surface of the leg and the base, wherein each leg defines a passage therein for controlled movement of the silicon melt therethrough.

2. The system of claim 1, wherein the body is formed as a single unit with at least one of the legs.

3. The system of claim 1, wherein the legs include an inner leg and an outer leg.

4. The system of claim 3, wherein the inner leg and the outer leg divide the silicon melt into an outer melt portion, an intermediate melt portion and an inner melt portion, the outer melt portion being located between the sidewall of the crucible and the outer leg, the intermediate portion being located between the outer leg and the inner leg, the inner melt portion being located inward from the inner leg.

5. The system of claim 1, wherein each passage is located along a lower portion of the respective leg.

6. The system of claim 1, wherein the passage of one of the legs is unaligned with the passages of another of the legs.

7. The system of claim 1, further comprising a feed tube disposed adjacent the crucible for supplying a feedstock material to the crucible, and a computing device for controlling a feed rate of the feedstock material through the feed tube.

8. The system of claim 1, further comprising a puller system for lowering and raising a seed crystal into and out of the silicon melt.

9. The system of claim 1, further comprising a heater disposed for supplying heat to the crucible to maintain the silicon melt therein, and a controller for adjusting the amount of heat provided by the heater to the crucible.

10. A method for growing a crystal ingot, the method comprising:
    providing a crucible with a weir, the weir having an inner leg and an outer leg forming a space therebetween
    placing a feedstock material into the crucible at a location that is outward of the weir;
    melting the feedstock material to form a melt able to flow to a location that is inward of the weir, wherein each leg engages a top surface of a base of the crucible to prevent flow of the melt between a bottom surface of the leg and the base, and wherein each leg defines a passage therein for controlled movement of the melt therethrough; and
    causing the melt to cool to form a crystal ingot.

11. The method of claim 10, wherein providing a crucible with a weir comprises providing a crucible with a weir including a body extending upward from the inner leg and the outer leg for separating an outer area of the crucible from an inner area of the crucible.

12. The method of claim 11, wherein providing a crucible with a weir comprises providing a crucible with a weir including a body extending upward from one of the inner leg and the outer leg.

13. The method of claim 10, further comprising directing the melt to flow through the passages.

14. The method of claim 10, further comprising measuring a temperature of the melt at a location immediately adjacent the forming crystal ingot.

15. The method of claim 10, wherein the forming of the crystal ingot is performed simultaneously with placing the feedstock material into the crucible.

16. The method of claim 10, further comprising placing a heater adjacent to the crucible for melting the feedstock material therein.

* * * * *